United States Patent [19]

O'Connor et al.

[11] 4,019,710

[45] Apr. 26, 1977

[54] INSTRUMENT SUPPORT SOCKET

[75] Inventors: Chadwell O'Connor, Newport Beach; Richard A. Charlson, Dana Point, both of Calif.

[73] Assignee: Chadwell O'Connor, Newport Beach, Calif.

[22] Filed: Feb. 11, 1976

[21] Appl. No.: 657,036

[52] U.S. Cl. .............................. 248/181; 248/288 B
[51] Int. Cl.² ...................................... F16M 11/14
[58] Field of Search ......................... 248/178–182, 248/288, 481–483; 403/90

[56] References Cited

UNITED STATES PATENTS

| 501,510 | 7/1893 | Hopkins et al. | 248/181 |
| 673,262 | 4/1901 | Hine | 248/181 |
| 807,078 | 12/1905 | Hoelzer | 248/181 |
| 3,843,083 | 10/1974 | Angibaud | 403/90 X |
| 3,974,994 | 8/1976 | Petterson | 248/181 X |

FOREIGN PATENTS OR APPLICATIONS

| 11,227 | 7/1891 | United Kingdom | 248/181 |
| 648,987 | 1/1951 | United Kingdom | 248/483 |
| 915,924 | 1/1963 | United Kingdom | 403/90 |

*Primary Examiner*—Lawrence J. Staab
*Attorney, Agent, or Firm*—Leydig, Voit, Osann, Mayer & Holt

[57] ABSTRACT

An instrument support leveling socket having relatively adjustable parts with interfitting spherical sectioned surfaces in which one of the surfaces is defined by a plurality of spaced feet so that the surface is sectioned and separated by substantial clearance spaces. A locking knob threaded into one of the parts and sandwiching the other selectively clamps the surfaces together against relative movement.

1 Claim, 5 Drawing Figures

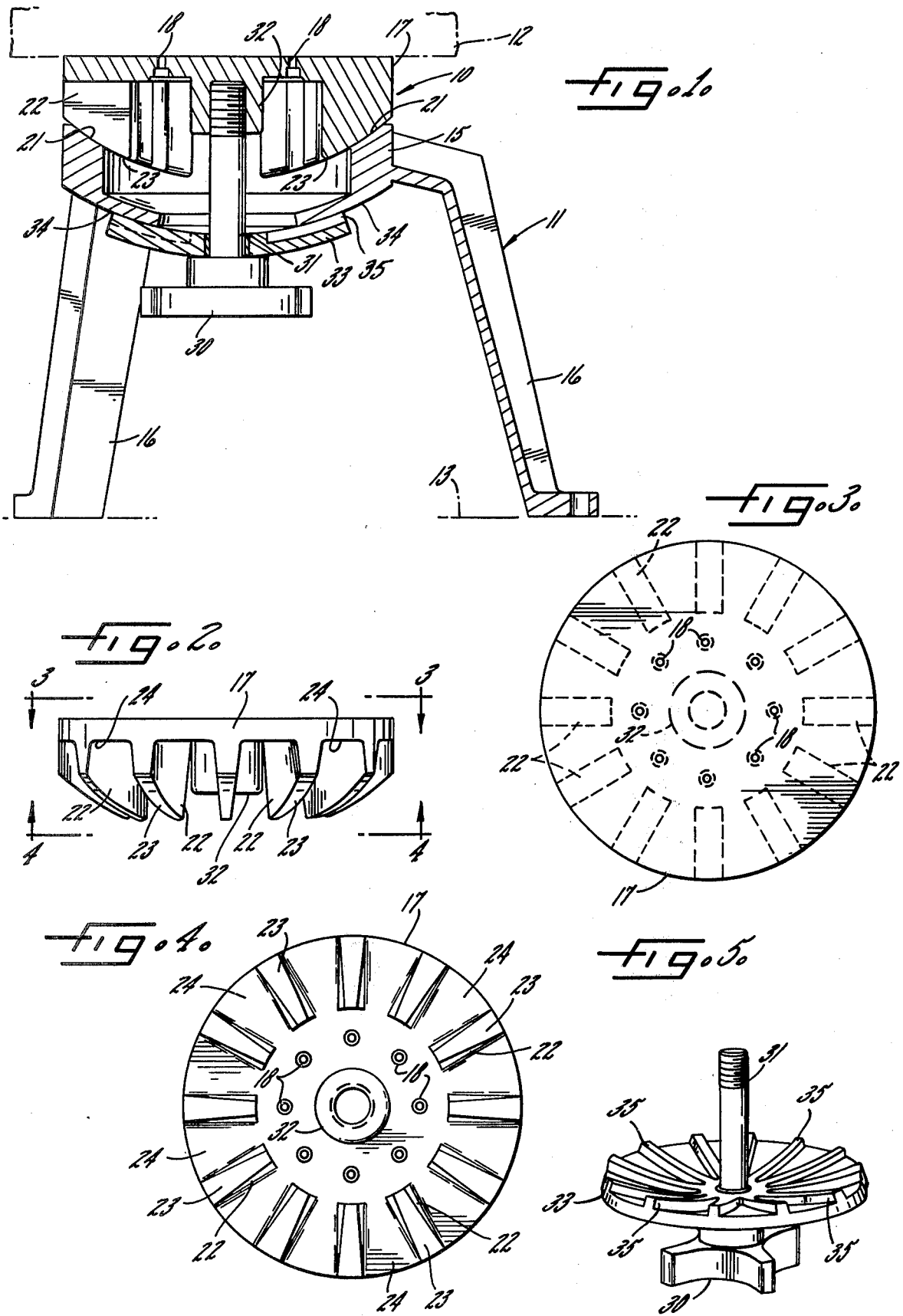

INSTRUMENT SUPPORT SOCKET

This invention relates generally to instrument support structures such as tripod heads and more particularly concerns a leveling socket for such structures.

Instruments such as cameras and telescopes are often supported on panheads or motor driven mounts which are carried on tripods or similar structures. Normally, one of the first steps in setting up such instruments is to level the support, and it usually is more convenient to provide some sort of leveling device between the tripod and the instrument panhead, as one example, rather than to level by adjusting the tripod legs.

It is the aim of the present invention to provide an instrument support leveling socket that can be quickly and easily adjusted, is capable of supporting considerable loads quite rigidly, and which is not subject to sticking or jamming even when used in difficult environmental conditions.

Another object is to provide a socket as characterized above that will freely lock and unlock upon application of fingertip force, and which is virtually self-cleaning so as to remain smooth in operation and easily lockable even when exposed to dirt, sand, water and similar adverse conditions.

A further object is to provide a socket as described above which is simple and straightforward in design so as to be rugged and long-lasting, and economical to manufacture.

Other objects and advantages of the invention will be apparent upon reading the following detailed description and upon reference to the drawing, in which:

FIG. 1 is a vertical section of an instrument support structure embodying the present invention;

FIG. 2 is a side elevation of one of the parts shown in FIG. 1;

FIGS. 3 and 4 are top and bottom plans taken along the lines 3—3 and 4—4, respectively, in FIG. 2; and FIG. 5 is a perspective of portions of the structure otherwise shown in FIG. 1.

While the invention will be described in connection with a preferred embodiment, it will be understood that we do not intend to limit the invention to that embodiment. On the contrary, we intend to cover all alternatives, modifications and equivalents as may be included within the spirit and scope of the invention as defined by the appended claims.

Turning to the drawing, there is shown a socket assembly 10 embodying the invention and forming part of a so-called hi-hat 11 for supporting an instrument 12 on a surface 13. The hi-hat 11 includes an upper ring 15 with three integral legs 16 adapted to rest on, or be secured to, the surface 13, and a circular plate 17 proportioned to fit over the ring 15 and which carries the instrument 12. In the illustrated embodiment, the upper surface of the plate 17 is flat and a plurality of holes 18 are provided for fastening whatever is to be supported directly to the plate. It will be apparent that other mounting configurations could well be provided on the upper surface of the plate 17 and that, instead of a hi-hat, the ring 15 could be part of a tripod or other kind of instrument support.

In accordance with the invention, the ring 15 defines an annular surface 21 that is a section of an internal spherical surface, and the plate 17 is formed with a plurality of spaced, radially extending feet 22 with surfaces 23 engaging the ring surface 21, the feet surfaces 23 defining segments of an annular surface that is a section of an external spherical surface having the same radius as the ring surface 21. The feet 22 are spaced and proportioned to define substantial clearance spaces 24 between adjacent feet 22, and the radially extending edges of the surfaces 23 of the feet 22 are preferably rather sharp.

It can thus be seen that the plate 17 will rock smoothly in the ring 15 in the manner of a ball and socket connection, permitting the plate 17 to be leveled relative to the ring 15 and its leg 16. The plurality of feet 22 give sturdy, rigid support for the plate and the instrument 12 mounted on the plate. The open centered ring 15, the spaces 24 between the feet, and the sharp edges of the surfaces 23 make the socket 10 self-cleaning and virtually unaffected by sand, dirt, water or other foreign particles likely to be encountered in adverse environmental conditions. Foreign material settling on the surface 21 will simply be scraped loose as the plate 17 is next adjusted.

The plate 17 and the ring 15 are selectively clamped by a locking knob 30 having a shank 31 threaded into a lug 32 at the center of the plate 17 and sandwiching a washer 33 against a clamping surface 34 on the ring 15. The washer 33 and the clamping surface 34 are also spherical sections having the same approximate centers as the surfaces 21 and 23. Therefore, a slight rotation of the knob 30 will loosen the parts and permit the plate 17 to be rocked into a desired position without increasing or decreasing the looseness of the washers 33 and, when the desired position of the plate 17 is reached, slight rotation of the knob 30 will again securely clamp the parts together.

The plurality of feet 22 give a substantially more solid clamping action that better resists sliding movement between the plate 17 and the ring 15 than would be obtained if the surfaces were conventionally continuously spherical. This is attributable to the substantially higher surface loading forces resulting from the fact that the feet surfaces 23 define far less than half the area of what would be a continuous surface equalling the area of the contracting surface 21. Thus, a given force exerted by tightening the knob 30 produces a high psi pressure between the surfaces 21 and 23, the high unit pressure causes the surfaces to effectively seize; a result, for example, directly opposite that desired for a sleeve bearing in which unit pressure is kept low to avoid seizing.

As a feature of the invention, the washer 33 is formed with ridges 35 that define an intermittent spherical surface for the washer 33 that mates with the clamping surface 33 and produces a more binding locking action between the washer and the ring 15 in the same manner as described in connection with the feet 22. This resistance to sliding of the washer 33 on the surface 34 when the knob 30 is tightened further stabilizes the plate 17.

It can thus be seen that a socket assembly 10 has been provided that can be quickly and easily leveled, is capable of supporting considerable loads quite rapidly and is not subject to jamming under difficult environmental conditions. The unit is basically rugged and straightforward in design so as to stand up well under hard usage as well as permitting economical manufacture.

We claim as our invention:

1. An instrument support comprising, in combination, a base having an upper ring defining an annular locking surface having a substantially open center, a plate adapted to mount an instrument and proportioned to fit over said ring, said plate having a plurality of spaced, radially extending feet with surfaces engaging said locking surface, said feet surfaces defining segments of an annular surface that is a section of an external spherical surface so that said plate rocks smoothly in said ring, said feet being spaced and proportioned to define substantial clearance spaces between adjacent feet, said feet surfaces terminating with sharp, radially extending edges so as to clean and better grip said locking surface, a threaded member for selectively drawing together and thus clamping said external spherical surfaces against said annular locking surface so as to prevent relative movement between said base and said plate, said member being threaded into said plate and sandwiching a washer against a clamping surface on said ring, said washer and said clamping surface defining spherical sections having the same approximate center as said internal and external spherical surfaces, and said washer spherical section being defined by a plurality of sharp edged ridges on the washer so as to substantially reduce the contacting area of said spherical sections.

* * * * *